United States Patent [19]

Maier

[11] 4,426,616

[45] Jan. 17, 1984

[54] CAPACITIVE MEASUREMENT SYSTEM

[75] Inventor: Lawrence C. Maier, New Haven, Vt.

[73] Assignee: Simmonds Precision Products, Inc., Tarrytown, N.Y.

[21] Appl. No.: 309,313

[22] Filed: Oct. 6, 1981

[51] Int. Cl.³ .......................................... G01R 27/00
[52] U.S. Cl. ................................ 324/57 R; 324/60 C; 324/62
[58] Field of Search ............ 324/60 C, 61 R, 61 QS, 324/57 R, 62

[56] References Cited

U.S. PATENT DOCUMENTS 2,929,020  3/1960  Mayes ......................... 324/61 R X
2,973,476  2/1961  Graham ........................ 324/57 R X
3,255,410  6/1966  Norwich ........................... 324/61 R
3,320,946  5/1967  Dethloff et al. ............. 324/57 R X Primary Examiner—Stanley T. Krawczewicz
Attorney, Agent, or Firm—Edwin E. Greigg

[57] ABSTRACT

A system for independently determining the capacitance and resistance of a capacitive sensor, in which the sensor and a reference capacitor are sequentially energized from two alternating voltage sources of different frequencies, and average sensor and reference capacitor current valves at the two frequencies are measured and supplied to a computer which periodically calculates the sensor capacitance and resistance.

7 Claims, 1 Drawing Figure

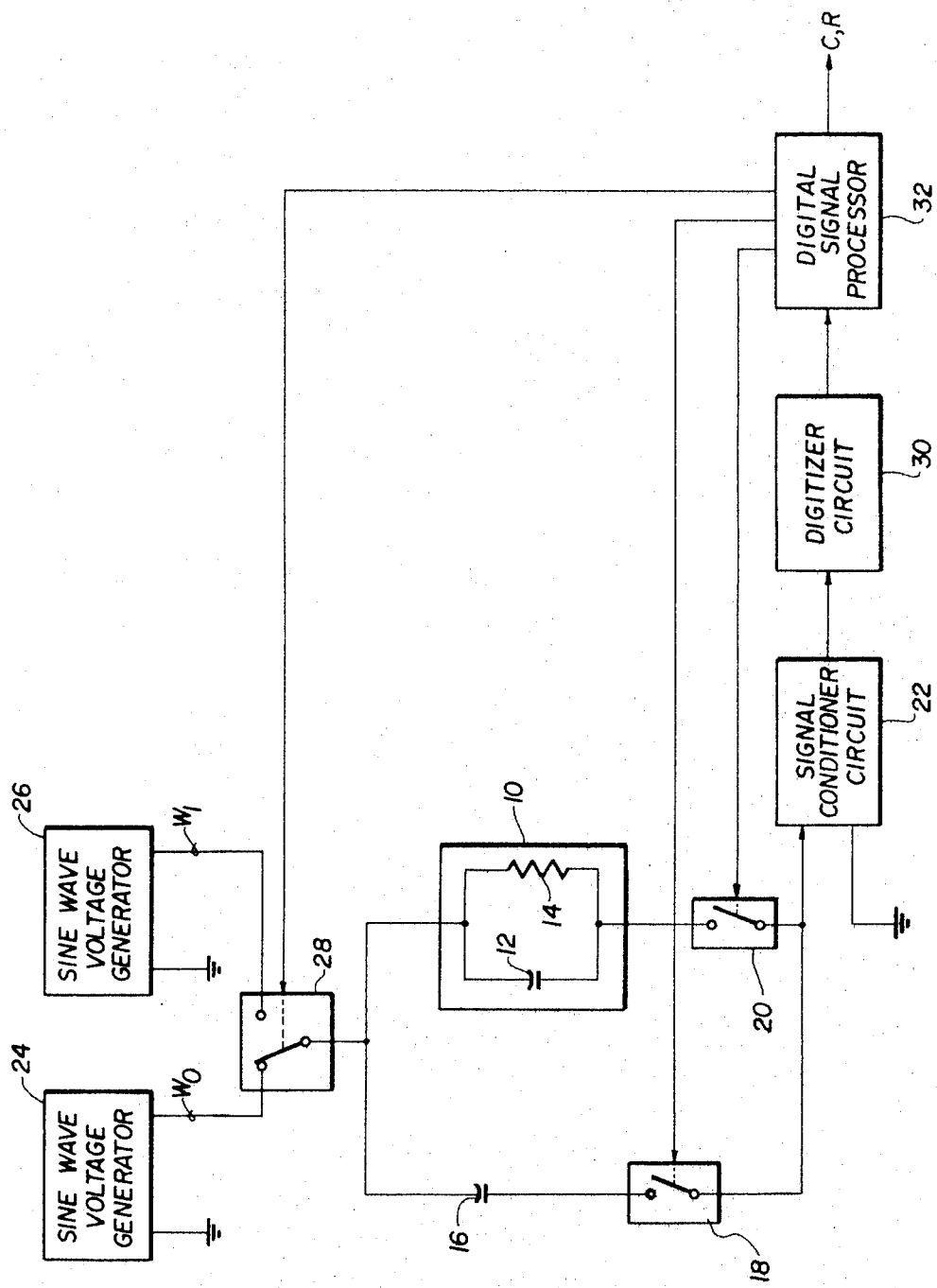

CAPACITIVE MEASUREMENT SYSTEM

BACKGROUND OF THE INVENTION

The invention relates to a system for measuring the capacitance value of a capacitor, and more particularly, to a system for measuring the capacitance of a capacitive sensor or probe having a parallel resistance component.

With any capacitive sensing system, system accuracy is dependent on the system sensing only the capacitive component of the capacitive probe signal, while ignoring any signal caused by resistive conductance of the probe.

In known systems for measuring the capacitance of a capacitor sensor, a quadrature detection system is employed to eliminate system response to the resistive component of the probe. The ability to reject the resistance signal and detect the capacitance signal using this approach is dependent upon the accuracy of deriving a signal 90° out of phase with the capacitance probe excitation. Even small phase errors of 1° can cause 1% or larger errors in measuring the capacitance value.

OBJECT AND SUMMARY OF THE INVENTION

Therefore, it is a primary object of the invention to provide a system for accurately measuring the capacitance of a capacitive probe, which is uneffected by the value of the resistive component of the probe.

It is a further object of the invention to provide such a capacitor measurement system in which the value of the capacitive probe resistive component is also accurately measured.

The invention includes a capacitive probe having a capacitive component and a resistive component, a reference capacitor of known value, and two alternating, constant voltage sources of different, known, frequencies.

During each measuring sequence of this system, the two frequency sources are used to alternately excite the capacitive probe and the reference capacitor. The average capacitive probe current at each frequency and the average reference capacitor current at each frequency is measured and supplied to a signal processor, which used these current values to calculate both the capacitance and resistance of the capacitive probe.

The invention will be better understood, and further objects of advantages will become more apparent, from the insuing detailed description of the preferred embodiment taken in conjunction with the drawing.

BRIEF DESCRIPTION OF THE DRAWING

The sole FIGURE is a simplified schematic diagram of the preferred embodiment of the invention, showing partially in block form.

DESCRIPTION OF THE PREFERRED EMBODIMENTS

The capacitance measurement system shown in the FIGURE includes a capacitive sensor or probe 10, which can be electrically represented by a capacitor 12 having a capacitance value which is proportional to the parameter sensed by the capacitor probe 10, and a resistor 14 connected across the capacitor 12 having a resistance value R which is a random stray resistance value related to contamination. The input side of a reference capacitor 16 having a known capacitance value $C_{ref}$ is connected to the input side of the sensor probe 10. The output sides of the reference capacitor 16 and the probe 10 are connected through respective single pole switches 18, 20, and a signal conditioner circuit 22 to ground.

The capacitance measurement system includes a first voltage sine wave generator 24 of a first frequency $W_0$ and a second voltage sine wave generator 26 of a second frequency $W_1$ which are alternately connected by a single pole, double throw, switch 28 to the input sides of the probe 10 and the reference capacitor 16. Typically, the second frequency $W_1$ is approximately twice the first frequency $W_0$.

The three switches 18, 20, and 28 determine a measurement circuit, one end of which is connected to either the first or second sine wave generator, 24 or 26, by the switch 28 and an opposite end of which is connected to ground through the signal conditioner circuit 22. The reference capacitor 16 is connected in the measurement circuit whenever the switch 18 is closed, and the probe 10 is connected in the measurement circuit whenever the switch 20 is closed.

The signal conditioner circuit 22, which typically includes an amplifier and a capacitive d.c. output filter, provides a direct voltage output signal which is proportional to the average alternating current flowing in the measurement circuit.

The output signal of the signal conditioner circuit 22 is converted to digitized current values by a digitizer circuit 30 which constitutes, with the signal conditioner circuit 22, a measuring channel of the system. These digitized current values are supplied to, and stored within, a digital signal processor 32, which periodically calculates the capacitance C from these values and other stored values.

The signal processor 32 control the switches 18, 20, and 28 to determine each measurement sequence, during which six digitized current values are measured and stored in the digital signal processor 32. These digitized current values include; (1) the digitized offset value $N_{Oo}$ of the measuring channel at the frequency $W_0$ when the switches 18, 20 are open and the switch 28 is connected to the first voltage sine wave generator 24; (2) the digitized offset value $N_{O1}$ of the measuring channel when the switches 18, 20 are open and the switch 28 is connected to the second voltage sine wave generator 26; (3) the digitized current value $N_{Dref0}$ of the average value of current flowing through the reference capacitor 16 when the switch 20 is open, the switch 18 is closed, and the switch 28 is connected to the first voltage sine wave generator 24; (4) the digitized current value $N_{Dref1}$ of the average value of current flowing through the reference capacitor 16 when the switch 20 is open, the switch 18 is closed, and the switch 28 is connected to the second voltage sine wave generator 26; (5) the digitized current value $N_{D0}$ of the average value of current flowing through the sensor probe 10 when the switch 18 is open, the switch 20 is closed, and the switch 28 is connected to the first voltage sine wave generator 24; and (6) the digitized current value $N_{D1}$ of the average current flowing through the sensor probe 10 when the switch 18 is open, the switch 20 is closed, and the switch 28 is connected to the second voltage sine wave generator 26. These six digitized values can be measured in any order during each measurement sequence.

Digitized values for the first and second frequencies $W_0$, $W_1$, and the capacitance $C_{ref}$ of the reference capacitor 16 are also stored by the signal processor 32.

The digitized average current values $N_{D0}$ and $N_{D1}$ of the sensor probe 10 are closely approximated by the following equations:

$$N_{D0} = \frac{mEp0}{\pi} \sqrt{(W_0C)^2 + 1/R^2} + N_{00} \quad \text{(eq. 1)}$$

$$N_{D1} = \frac{mEp1}{\pi} \sqrt{(W_1C)^2 + 1/R^2} + N_{01} \quad \text{(eq. 2)}$$

where Epo is the peak output voltage of the first voltage sine wave generator 24;

Epl is the peak output voltage of the second voltage sine wave; and m is the gain of the measuring channel.

The valve of m Epo/$\pi$ may be determined from the measured current flowing through the reference capacitor 16 when the reference capacitor is energized at the first frequency $W_0$, from the first voltage sine wave generator 24. Similarly, the value of mEpl/$\pi$ may be determined from the measured current flowing through the reference capacitor 16 when the reference capacitor is energized at the second frequency $W_1$ from the second voltage sine wave generator 26.

A value $I_0$ equal to the admittance $$\sqrt{(W_0C)^2 + 1/R^2}$$

of the probe 10 at the first frequency $W_0$, and a value $I_1$, equal to the admittance $$\sqrt{(W_1C)^2 + 1/R^2}$$

of the probe 10, may be calculated in accordance with the following equations:

$$I_0 = \frac{(N_{D0} - N_{00}) W_0 C_{ref}}{(N_{Dref0} - N_{00})} \quad \text{(eq. 3)}$$

$$I_1 = \frac{(N_{D1} - N_{00}) W_1 C_{ref}}{(N_{Dref1} - N_{01})} \quad \text{(eq. 4)}$$

The digital signal processor 32 calculates the capacitance value C of the measuring probe 10 in accordance with equations 3 and 4 above, and the following equation:

$$C = \sqrt{\frac{I_1^2 - I_0^2}{W_1^2 - W_0^2}} \quad \text{(eq. 5)}$$

The capacitance value C of the probe 10 obtained from equation 5 above, is independent of any parallel resistance R of the capacitive probe 10. Thus, the probe capacitance value C is very accurately measured (hence preserving the accuracy of the measurement of the physical parameter being sensed by the probe 10) even in the presence of low parallel resistance values R.

Also, if desired, the digital signal processor 32 may be programmed to calculate the parallel resistance R of the probe 10 in accordance with the following equation:

$$R = \sqrt{\frac{W_1^2 - W_0^2}{(W_1I_0)^2 - (W_0I_1)^2}} \quad \text{(eq. 6)}$$

The parallel resistance R in equation 6 above is determined independently of the capacitance C of the probe 10.

In addition, the capacitance C and resistance R of the probe 10 are measured independently of any analog circuit errors due to the normalizing process shown in equations 3 and 4 above.

There are many variations or modifications of this invention which will be obvious to one skilled in the art. For example, if the $N_O$ offset values, which typically affect the measurement accuracy by only a fraction of one percent, are neglected, and circuit parameters such as the gain of the measurement channel and the frequencies and magnitudes of the two voltage sine wave generators, are maintained at fixed values, the two switches 18, 20 and the reference capacitor 16 can be replaced by two constants $K_0$, $K_1$ stored by the digital signal processor 32, and only the digitized current values $N_{D0}$, $N_{D1}$ of the probe 10 are determined each measurement sequence. In such a simplified variation of the invention, the digital signal processor 32 periodically calculates the probe capacitance C as follows:

$$C = \sqrt{\frac{(K_1N_1)^2 - (K_0N_0)^2}{W_1^2 - W_0^2}}$$

Since many variations, additions, or modifications are possible within the spirit and scope of the invention, it is intended that the scope of the invention be only limited by the appended claims.

What is claimed and desired to be secured by Letters Patent of the United States is:

1. A system for measuring the capacitance C of a capacitor independently of the resistance R of a resistor connected in parallel with said capacitor, which comprises:

a first source of alternating sinusoidal voltage of a first frequency $W_0$;

a second source of alternating sinusoidal voltage of a different second frequency $W_1$;

switch means for alternatively connecting said capacitor and parallel resistor to said first and second sources during successive intervals;

current measurement means for providing average values of current supplied to said capacitor and parallel resistor, said current measurement means providing an average current value $N_0$ during an interval with said capacitor and parallel resistor is connected to said first source and providing an average current value $N_1$ during an interval when said capacitor and parallel resistor are connected to said second source; and computer means for calculating said capacitance in accordance with an equation $$C = \sqrt{\frac{(K_1N_1)^2 - (K_0N_0)^2}{W_1^2 - W_0^2}}$$

where $K_0$ is a multiplier constant for converting the current value $N_0$ to an admittance value $(W_0C)^2+1/R^2$, and $K_1$ is a multiplier constant for converting the current value $N_1$ to an admittance value $(W_1C)^2+1/R^2$.

2. A system as described in claim 1, wherein said computer means also calculates the resistance R in accordance with the equation $$R = \sqrt{\frac{W_1^2 - W_0^2}{(W_1K_0N_0)^2 - (W_0K_1N_1)^2}}$$

3. A system for measuring the capacitance C of a capacitor independently of a resistance R of a resistor connected in parallel with said capacitor, which comprises:
- a first source of alternating sinusoidal voltage of a first frequency $W_0$;
- a second source of alternating sinusoidal voltage of a different second frequency $W_1$;
- a measurement circuit;
- first switch means for alternatively energizing said measurement circuit from said first and second sources, respectfully;
- a reference capacitor of known capacitance $C_{ref}$;
- second switch means for alternatively energizing said reference capacitor and said capacitor and parallel resistor combination from said measurement circuit;
- switch control means for operating said first and second switch means, to dispose these switch means in four arrangements during respective time intervals of a measurement sequence, said four arrangements including:
- a first arrangement wherein said reference capacitor is energized by said first source,
- a second arrangement wherein said reference capacitor is energized by said second source,
- a third arrangement wherein said capacitor and parallel resistor is energized from said first source, and
- a fourth arrangement wherein said capacitor and parallel resistor is energized from said second source;
- current measurement means for determining average current values of the measurement circuit, including:
- an average current value $N_{ref0}$, during a time interval when said first and second switch means are disposed in said first arrangement,
- an average current value $N_{ref1}$, during a time interval when said first and second switch means are disposed in said second arrangement,
- an average current value $N_0$, during a time interval when said first and second switch means are disposed in said third arrangement, and
- an average current value $N_1$, during a time interval when said first and second switch means are disposed in said fourth arrangement; and
- a computer which includes:
- storage means for including and storing said current values, and
- calculating means for calculating said capacitance C in accordance with the equation $$C = \sqrt{\frac{I_1^2 - I_0^2}{W_1^2 - W_0^2}} \text{ wherein } I_0 = \sqrt{\frac{N_0W_0C_{ref}}{N_{ref0}}} \text{ and}$$

$$I_1 = \sqrt{\frac{N_1W_1C_{ref1}}{N_{ref1}}}$$

4. A system, as described in claim 3, wherein the resistance R of said resistor is calculated by said calculating means in accordance with the equation $$R = \sqrt{\frac{W_1^2 - W_0^2}{(W_1I_0)^2 - (W_0I_1)^2}}$$

5. A system for measuring the capacitance C of a capacitor independently of a resistance R of a resistor connected in parallel with said capacitor, which comprises:
- a first source of alternating sinusoidal voltage of a first frequency $W_0$;
- a second source of alternating sinusoidal voltage of a different second frequency $W_1$;
- a measurement circuit which comprises:
  - a first branch including a reference capacitor of known capacitance $C_{ref}$, and
  - a second branch connected in parallel with said first branch and including said capacitor and parallel resistor;
- a first switch means for alternately energizing said measurement circuit from said first and second source, respectively;
- a second switch means, disposed in series with said reference capacitor in said first branch, for alternatively energizing or de-energizing said reference capacitor;
- a third switch means, disposed in series with said capacitor and parallel resistor or de-energizing said capacitor and parallel resistor;
- a switch control timer means for operating said first, second, and third switch means to define a plurality of measurement circuit arrangements which occur sequentially in any selected order of occurrence during respective time intervals of a measurement sequence, said circuit arrangements including:
- a first arrangement wherein said measurement circuit is energized from said first source and said second and third switch means are open,
- a second arrangement wherein said measurement circuit is energized from said second source and said second and third switch means are open,
- a third arrangement wherein said measurement circuit is energized from said first source, said second switch means is closed and said third switch means is open,
- a fourth arrangement wherein said measurement circuit is energized from said second source, said second switch means is closed and said third switch means is open,
- a fifth arrangement wherein said measurement circuit is energized from said first source, said second switch means is open, and said third switch means is closed, and
- a sixth arrangement wherein said measurement circuit is energized from said second source, said second switch means is open, and said third switch means is closed;

current measurement means for generating a plurality of digitized average current values of the measurement circuit current during respective time intervals of said measurement sequence, said digitized average current value including;

a value $N_{O0}$ which occurs during an interval when said measurement circuit is disposed in said first arrangement, a value $o_1$ which occurs during an interval when said measurement circuit is disposed in said second arrangement, a value $N_{Dref0}$ which occurs during an interval when said measurement circuit is disposed in said third arrangement, a value $N_{Dref1}$ which occurs during an interval when said measurement circuit is disposed in said fourth arrangement, a value $N_{D0}$ which occurs during an interval when said measurement circuit is disposed in said fifth arrangement, and a value $N_{D1}$ which occurs during an interval when said measurement circuit is disposed in said sixth arrangement; and a computer which includes:

storage means for securing and storing said plurality of digitized current values, and calculating means for periodically calculating said capacitance C in accordance with the equation $$C = \sqrt{\frac{I_1^2 - I_0^2}{W_1^2 - W_0^2}} \text{ wherein}$$

$$I_0 = \sqrt{\frac{(N_{D0} - N_{00}) W_0 C_{ref}}{(N_{Dref0} - N_{00})}} \text{ and}$$

$$I_1 = \sqrt{\frac{(N_{D1} - N_{01}) W_1 C_{ref}}{(N_{Dref1} - N_{01})}}$$

6. A system, as described in claim 5, wherein the resistance R of said resistor is periodically calculated by said calculating means in accordance with the equation $$R = \sqrt{\frac{W_1^2 - W_0^2}{(W_1 I_0)^2 - (W_0 I_1)^2}}$$

7. A system as described in claim 5, wherein said current measurement means comprises:

signal conditioner means for closing the alternating current of said measurement circuit and generating a direct voltage signal proportional to an average value of the measurement circuit alternating current; and digitizer means, connected to receive said direct voltage signal for generating said digitized average current values of the measurement circuit current.

* * * * *